United States Patent [19]

Woodward et al.

[11] Patent Number: 5,447,450
[45] Date of Patent: Sep. 5, 1995

[54] LIVE WIRE DETECTION ADAPTER WITH GROUNDING CAPABILITY

[76] Inventors: Carl W. Woodward, 4531 W. Monte Cristo, Glendale, Ariz. 85306; John A. Martinez, 18608 N. 4th Ave., Phoenix, Ariz. 85027

[21] Appl. No.: 200,017

[22] Filed: Feb. 22, 1994

[51] Int. Cl.$^6$ ............................................. H01R 4/24
[52] U.S. Cl. ........................................ 439/417; 439/425
[58] Field of Search .................... 439/409, 411–412, 439/417–418, 425–426, 259; 324/508–511, 522, 538

[56] References Cited

U.S. PATENT DOCUMENTS

| | | | |
|---|---|---|---|
| 2,844,749 | 7/1958 | Shetterly | 439/417 |
| 3,363,171 | 1/1968 | Sietmann et al. | 324/51 |
| 3,372,361 | 3/1968 | Wengen | 339/97 |
| 3,662,259 | 5/1972 | Dapilito | 324/51 |
| 3,768,005 | 10/1973 | Louks | 324/51 |
| 3,996,551 | 12/1976 | Baer | 324/51 |
| 4,709,339 | 11/1987 | Fernandes | 324/492 |
| 4,799,005 | 1/1989 | Fernandes | 324/127 |
| 5,367,251 | 11/1994 | McTigue et al. | 324/133 |

FOREIGN PATENT DOCUMENTS 936115  6/1994  U.S.S.R. ............... 439/197

Primary Examiner—Larry I. Schwartz
Assistant Examiner—Jill DeMello
Attorney, Agent, or Firm—Kajane McManus

[57] ABSTRACT

The adapter for use on a compression tool to create a live wire detecting and grounding device comprises a spike engaged to a hydraulically actuated plunger of the tool, the plunger being movable with a jaw defined by a C shaped body of the tool. The spike is conductive, is engaged to a grounding assembly and is used to engage a core of an electrical cable snared within the jaw, causing shorting of a controller for the cable, making the cable currentless. For use with cables of smaller diameter, a reducing sleeve is provided for holding such cables for spike piercing thereof.

6 Claims, 2 Drawing Sheets

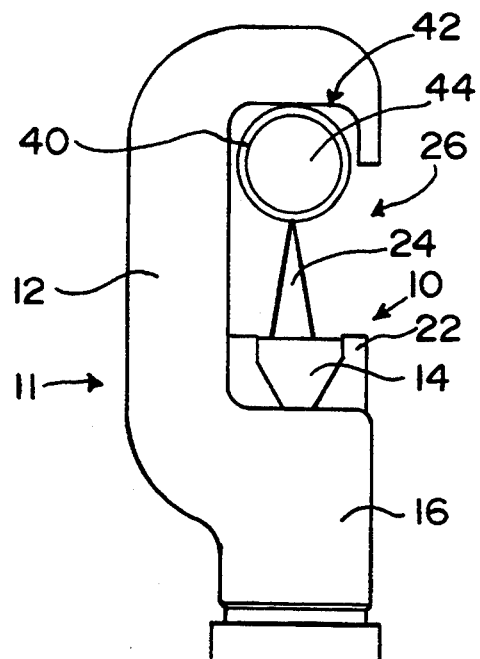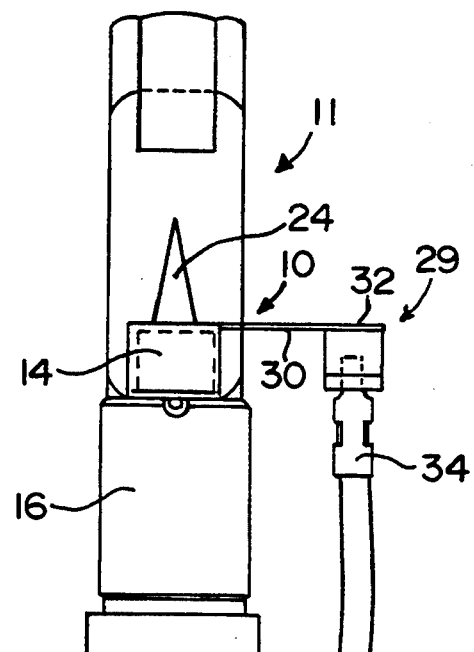

LIVE WIRE DETECTION ADAPTER WITH GROUNDING CAPABILITY

BACKGROUND OF THE INVENTION

1. Field of the Invention

The present invention relates to an adapter which will detect when a current is present on a power line, with such current, if detected, being groundable to produce a fault current condition to cause deadening of the power line by destroying current control means upstream of the device engaging point. The adapter is designed to be used with a compression tool, the tool providing hydraulic power to manipulate the adapter around a cable.

2. Description of the Prior Art

Heretofore various electrical circuit continuity testers having cable piercing capability have been proposed.

Various embodiments of such testers are disclosed in the following US Patents:

| U.S. Pat. No. | Patentee |
| --- | --- |
| 467,891 | New |
| 3,363,171 | Seitmann et al |
| 3,662,259 | Dapilito |
| 3,768,005 | Louks |
| 3,996,511 | Baer |

Each of these patents discloses a tester which operates by piercing the insulation on a wire to be tested so that electrical contact is made and provides a means for visibly indicating continuity of the wire.

However, as will be described in greater detail hereinafter, none of these patents disclose a hydraulically operated device adapted to be used for the piercing of buried high voltage cables and, if current is detected thereon, may further be used to create a fault condition on the cable to render an upstream component, such as a circuit breaker, to trip, leaving the cable currentless so it can be repaired.

SUMMARY OF THE INVENTION

According to the invention there is provided an adapter for use with a compression tool defining a jaw having a predetermined height and having hydraulic actuating means for modifying the height of the jaw by moving a plunger within the jaw, the adapter comprising a cable piercing spike mounted to the plunger and extending into the jaw, the hydraulic means moving the plunger to push the spike into contact with a core of an electrical cable engaged within the jaw, the spike having a grounding assembly engaged thereto for grounding the cable if current is flowing therethrough.

BRIEF DESCRIPTION OF THE DRAWINGS

FIG. 1 is a side view of the adapter of the present invention shown mounted to hydraulic activating components therefor and showing a cable to be pierced with the adapter.

FIG. 2 is an end view of the adapter and activator.

DESCRIPTION OF THE PREFERRED EMBODIMENT

Figures 3, 4, 5, 6:
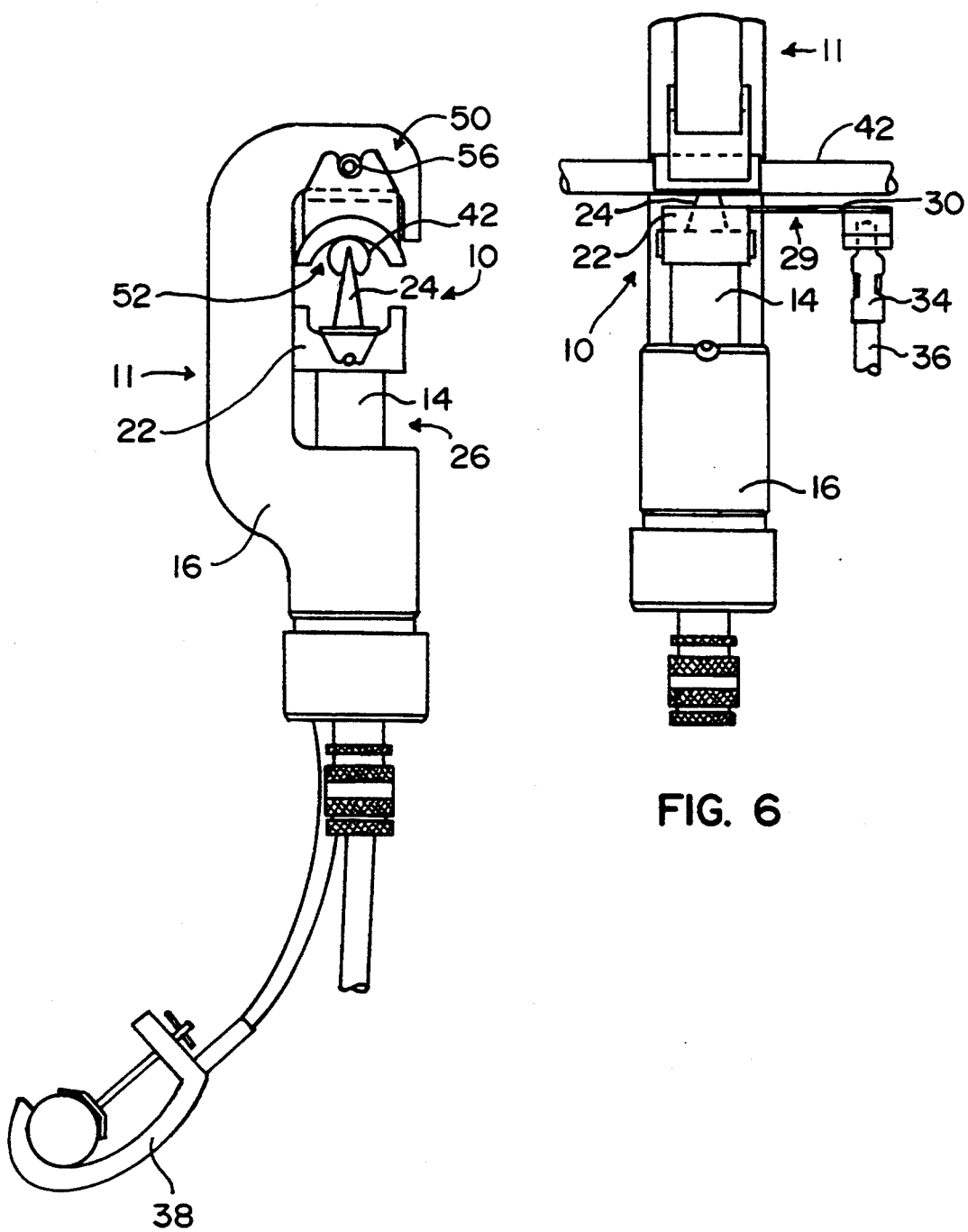
FIG. 3 is a side view of a reducer sleeve used with the adapter for engaging a smaller diameter cable with the tool.
FIG. 4 is an end view of the sleeve of FIG. 3.
FIG. 5 is a side view showing the adapter and sleeve in use for puncturing a small diameter cable.
FIG. 6 is an end view of the structures of FIG. 5.

Referring now to the drawings in greater detail, there is illustrated therein the live wire detection adapter with grounding capability made in accordance with the teachings of the present invention and generally identified by the reference numeral 10.

The adapter 10 is designed to be mounted to a hydraulic compression tool 11 having a C-shaped body 12 which includes a hydraulic compression element or a base plunger 14 slidably engaged within a base 16 of the body 12 which is operated to elevate it from its seated position.

The body 12 in its basic form is available for purchase from Brock Equipment Company of Crystal Lake, Illinois and is described as a Model 15-UVR Universal Compression Tool.

To the plunger 14 of the body 12 is attached the adapter 10 which includes a platform 22 configured to be securely mounted to the plunger 14. From this platform 22 a conical piercing element or spike 24 extends into a jaw area 26 defined by the C shaped body 12 of the tool 11.

Attached to the spike 24 and extending laterally therefrom is a grounding assembly 29 here shown as a planar element 30 which engages at a free end 32 thereof a grounding member 34.

This grounding member 34, in one preferred embodiment comprises a conductive cable 36 which terminates in a clamp 38.

It will be understood that the spike 24 is a conductive member which is hydraulically forced through an insulation layer 40 of a cable 42, into contact with a current carrying core 44 thereof. Once the spike 24 contacts the core 44, with the grounding member 34 being connected to ground, if in fact the cable 42 is alive, a ground fault condition is created which will cause shorting of an upstream controller for the cable 42, such as a circuit breaker (not shown). Upon shorting of the controller, the cable 42 is rendered currentless, making same safe to be worked on by a worker.

As is known, cables 42 may be of large diameter or small diameter. To accommodate cables 42 having a diameter significantly smaller than the opening within the jaw area 26 of the tool 11, a reducing sleeve 50 which locks onto the tool 11 has been proposed. This sleeve 50 defines a semi-cylindrical channel 52 which depends into the jaw area 26 of the tool and secures a small diameter cable 42 in a position therein for piercing by the spike 24, securing the cable 42 against slipping away from the spike 24 as it is brought toward the cable 42.

The reducing sleeve has upstanding flanges 54 thereon which are notched to engage a nub 56 on either side of the body 12 of the tool, as shown. When engaged, the flanges 54 have an extent which places the cable 42 at a position which will allow the spike 24 to pierce through the cable 42, and move into contact with the core 44 thereof, It will be understood that the cables 42 to be engaged hereby are of the high voltage type which are typically buried.

This has necessitated a worker to enter a ditch to obtain access to the cable 42 and to use a mechanical, non-hydraulic device to attempt piercing the cable 42 by hand.

With the adapter 10 of the present invention mounted on a hydraulic tool 11, a worker may drop the tool 11 with adapter 10 therein into the ditch, snag the cable 42, and ground same while maintaining his distance therefrom until the cable 42 is grounded, with the hydraulic activation allowing for piercing of thick or thin cables 42, without regard to the depth of insulation thereon.

As described above the adapter 10 of the present invention provides a number of advantages, some of which have been described above and others of which are inherent in the invention.

Also, modifications may be proposed to the adapter 10 of the present invention without departing from the teachings herein. Accordingly, the scope of the invention is only to be limited as necessitated by the accompanying claims.

We claim:

1. A live wire detection adapter with grounding capability for use with an hydraulic compression tool, the tool having a jaw of a predetermined height and having hydraulic actuating means for modifying the height of the jaw, the hydraulic actuating means including a plunger within the jaw, the adapter comprising a cable piercing spike mounted by a platform to the plunger of the tool and extending into the jaw of the tool, the spike having a grounding assembly engaged thereto for grounding an electrical high voltage cable pierced by the spike if current is flowing therethrough.

2. The adapter of claim 1 wherein said spike is made of conductive material.

3. The adapter of claim 1 wherein said grounding assembly comprises at least an electrical cable having a clamp at one end thereof with a second end of the electrical cable being engaged to the spike.

4. The adapter of claim 1 further including a reducing sleeve which is mountable within the jaw of the compression tool to hold cables of small diameter in place within the jaw for piercing by the spike.

5. The adapter of claim 4 wherein said reducing sleeve has two flanges extending therefrom, each flange having a notch therein which is positioned and configured to engage a hub on each side surface of the jaw.

6. The adapter of claim 5 wherein said reducing sleeve comprises a semi-cylindrical member extending across the jaw, a cable being cradled therein.

* * * * *